US010108222B2

(12) United States Patent
Gupta et al.

(10) Patent No.: US 10,108,222 B2
(45) Date of Patent: Oct. 23, 2018

(54) ELECTRONIC DEVICE DISPLAYS WITH HOLES TO ACCOMMODATE COMPONENTS

(71) Applicant: Apple Inc., Cupertino, CA (US)

(72) Inventors: Nathan K. Gupta, San Francisco, CA (US); Sudirukkuge T. Jinasundera, San Jose, CA (US); Myunghun Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 24 days.

(21) Appl. No.: 15/177,252

(22) Filed: Jun. 8, 2016

(65) Prior Publication Data

US 2017/0160766 A1 Jun. 8, 2017

Related U.S. Application Data

(60) Provisional application No. 62/263,111, filed on Dec. 4, 2015.

(51) Int. Cl.
| | |
|---|---|
| *G02F 1/1339* | (2006.01) |
| *G06F 1/16* | (2006.01) |
| *H04N 5/225* | (2006.01) |
| *H01L 27/12* | (2006.01) |
| *G02F 1/1368* | (2006.01) |
| *G02F 1/1335* | (2006.01) |
| *G02F 1/1333* | (2006.01) |

(52) U.S. Cl.
CPC .......... *G06F 1/1605* (2013.01); *G02F 1/1339* (2013.01); *G02F 1/1368* (2013.01); *G02F 1/13394* (2013.01); *G02F 1/133308* (2013.01); *G02F 1/133514* (2013.01); *G06F 1/1686* (2013.01); *H01L 27/1214* (2013.01); *H04N 5/2257* (2013.01)

(58) Field of Classification Search
CPC .................................................... G06F 1/1605
See application file for complete search history.

(56) References Cited

U.S. PATENT DOCUMENTS

| 7,488,145 B2 | 2/2009 | Watanabe et al. |
| 8,743,309 B2 | 6/2014 | Mathew et al. |
| 2010/0315570 A1* | 12/2010 | Mathew ............... G06F 1/1637 349/58 |

(Continued)

FOREIGN PATENT DOCUMENTS

| CN | 201510219230.1 | * 4/2015 | .......... G02F 1/1335 |
| JP | 2000250049 A | 9/2000 | |

*Primary Examiner* — Sang V Nguyen
(74) *Attorney, Agent, or Firm* — Treyz Law Group, P.C.; G. Victor Treyz; David K. Cole

(57) ABSTRACT

An electronic device may have a display. The display may be mounted in a housing and may have a window to accommodate a camera or other electrical component. The display may have multiple substrate layers. A hole may be formed in one of the substrate layers to form additional space within the housing to accommodate the electrical component. The hole may be drilled partway through a substrate layer to form an annular thinned region. The annular thinned region may be cracked to release a disk-shaped portion of the substrate layer and form the hole. A ring of sealant may surround the hole to help cushion the display substrate layers during drilling operations. Column spacer structures may be formed on a portion of a display substrate that is overlapped by the hole.

18 Claims, 11 Drawing Sheets

(56) References Cited

U.S. PATENT DOCUMENTS

| | | | |
|---|---|---|---|
| 2011/0159319 A1 | 6/2011 | Yamasaki et al. | |
| 2012/0105400 A1* | 5/2012 | Mathew | H04N 5/2251 345/207 |
| 2012/0206669 A1* | 8/2012 | Kim | G06F 1/1686 349/58 |
| 2012/0327325 A1* | 12/2012 | Park | G06F 1/1637 349/58 |
| 2013/0258234 A1* | 10/2013 | Park | G02F 1/133512 349/58 |
| 2013/0329460 A1* | 12/2013 | Mathew | H05K 5/02 362/612 |
| 2014/0063407 A1* | 3/2014 | Kwon | G02F 1/13338 349/58 |
| 2014/0307207 A1 | 10/2014 | Ge et al. | |
| 2014/0316198 A1* | 10/2014 | Krivopisk | A61B 1/00181 600/109 |
| 2015/0029432 A1* | 1/2015 | Ishikawa | G02F 1/13394 349/43 |
| 2016/0154198 A1* | 6/2016 | Alasimio | G03B 17/02 348/335 |
| 2016/0320663 A1* | 11/2016 | Hao | G02F 1/133516 |
| 2017/0126943 A1* | 5/2017 | Fletcher | H04N 5/2254 |
| 2017/0150022 A1* | 5/2017 | Shigemitsu | G02B 7/04 |

\* cited by examiner

ELECTRONIC DEVICE DISPLAYS WITH HOLES TO ACCOMMODATE COMPONENTS

This application claims the benefit of provisional patent application No. 62/263,111, filed Dec. 4, 2015, which is hereby incorporated by reference herein in its entirety.

FIELD

This relates generally to electronic devices and, more particularly, to electronic devices with displays.

BACKGROUND

Electronic devices often contain displays. For example, laptop computers, cellular telephones, tablet computers, and desktop computers may contain displays. Devices such as these may also include components such as cameras.

It can be challenging to design an electronic device that includes a display and a component such as a camera. If care is not taken, display bezels may be larger than desired to accommodate camera windows, cameras may be required to receive light through transparent layers of material that are thicker than desired, the thickness of a display may limit space available for mounting a camera within a device, or other undesired compromises may be made that detract from device aesthetics and device performance.

SUMMARY

An electronic device may have a display. The display may be mounted in a housing and may have a window to accommodate a camera or other electrical component. The display may have multiple substrate layers such as a thin-film transistor layer and a color filter layer. A layer of liquid crystal material may be interposed between substrate layers.

A hole may be formed in a first of the substrate layers to form additional space within the housing to accommodate a camera or other electrical component. An opaque masking layer on a second of the substrate layers may have an opening that forms a window in the display. The window in the display may be aligned with the camera or other electrical component.

The hole may be formed using drilling and breaking operations. A drilling tool may be used to drill an annular groove in the first substrate layer. A thinned annular region may be formed within the groove. The annular thinned region may be cracked to release a disk-shaped portion of the first substrate layer and thereby form the hole. A ring of sealant may surround the hole to help cushion the display substrate layers during drilling operations. Column spacer structures may be formed on a portion of a display substrate that is overlapped by the hole.

DETAILED DESCRIPTION

Electronic devices may be provided with displays. A display may have an active area containing an array of pixels that is used to display images and an inactive area that is free of pixels. Circuitry and internal device components may be mounted under the inactive area. The display may have layers of material such as thin-film transistor layers, color filter layers, and optional cover glass layers.

A window for a light-based component may be formed in the display. For example, a window may be formed in the inactive area of the display or within the active area of the display. A light-based component may be aligned with the window. During operation, light may pass through the window. For example, a camera that is aligned with the window may receive light through the window.

To help accommodate a camera, other light-based components, other electrical components (sensors, buttons, integrated circuits, etc.), or other components within an electronic device, a hole may be formed in a display. For example, a hole may be formed that passes partway through the display. The hole may provide additional space within an electronic device for mounting a component. For example, a hole may be formed in alignment with a window for a camera or other light-based component and may help accommodate the component within the housing of an electronic device.

Figure 1:
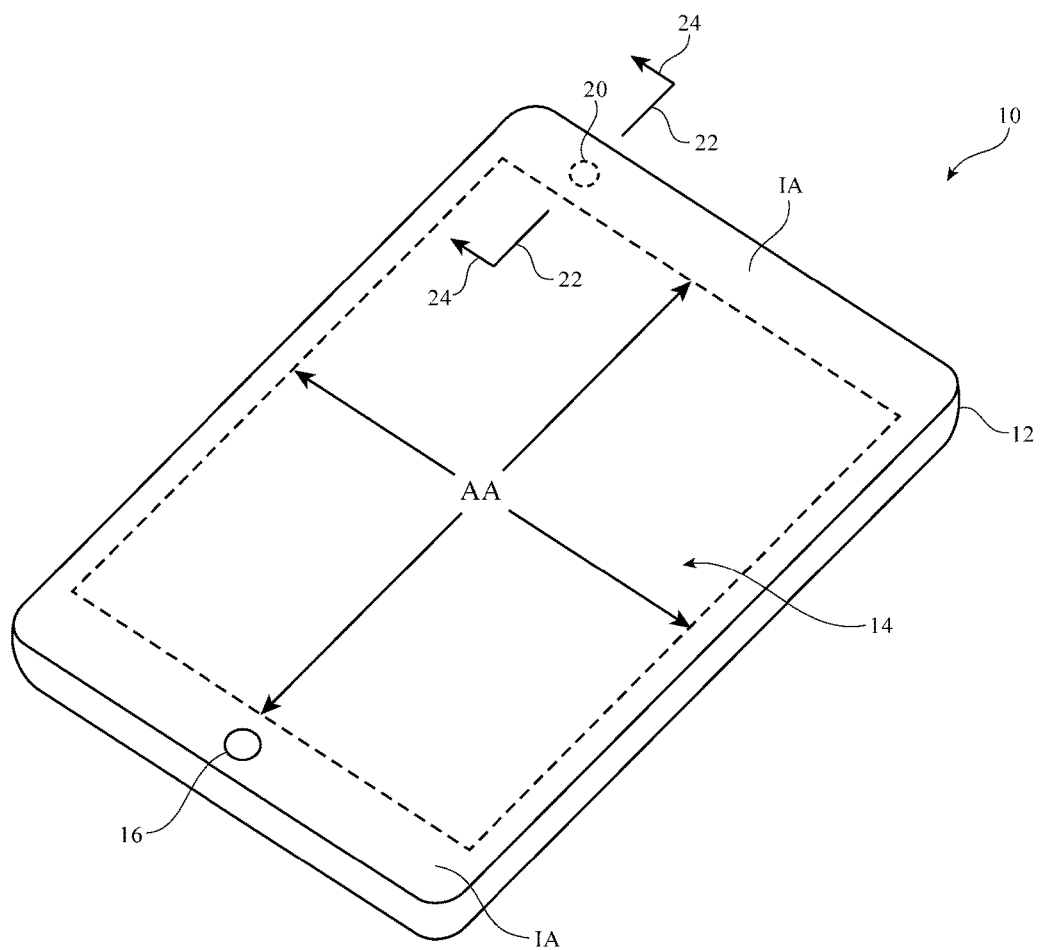
FIG. 1 is a perspective view of an illustrative electronic device in accordance with an embodiment.

FIG. 1 is a perspective view of an illustrative electronic device of the type that may include a display with a hole. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

In the example of FIG. 1, device 10 includes display 14. Display 14 has been mounted in housing 12. In the FIG. 1 arrangement, housing 12 has a planar shape. In a laptop computer or other structure with a hinge, housing 12 may have upper and lower portions that rotate with respect to each other about the hinge. In this type of arrangement, display 14 may be mounted in the upper housing and a keyboard, trackpad, and other components may be mounted in the lower housing (as an example).

Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Openings may be formed in housing 12 to form communications ports, holes for buttons, and other structures.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch sensor electrodes may be formed from an array of indium tin oxide pads or other transparent conductive structures.

Display 14 may have an active area AA that includes an array of pixels. The array of pixels may be formed from liquid crystal display (LCD) components, an array of electrophoretic pixels, an array of plasma display pixels, an array of organic light-emitting diode pixels or other light-emitting diode pixels, an array of electrowetting pixels, or pixels based on other display technologies. Illustrative configurations for display 14 in which display 14 is a liquid crystal display may sometimes be described herein as an example. This is merely an example. Display 14 may be any suitable type of display.

Display 14 may be protected using a display cover layer such as a layer of transparent glass, clear plastic, transparent ceramic, sapphire or other transparent crystalline material, or other transparent layer(s). The display cover layer may have a planar shape, a convex curved profile, a concave curved profile, a shape with planar and curved portions, a layout that includes a planar main area surrounded on one or more edges with a portion that is bent out of the plane of the planar main area, or other suitable shape. Openings may be formed in the display cover layer to accommodate button 16, speaker ports, and other structures. If desired, the display cover layer may be omitted. For example, in a liquid crystal display with a substrate layers such as a color filter layer, thin-film transistor layer, or combined color filter and thin-film transistor layers, one or more of the substrate layers may be used as the outermost layer of display 14 in place of a display cover layer.

Display 14 may have an inactive border region that runs along one or more of the edges of active area AA. Inactive area IA may be free of pixels for displaying images and may overlap circuitry and other internal device structures in housing 12. To block these structures from view by a user of device 10, the underside of the display cover layer or other layer in display 14 that overlaps inactive area IA may be coated with an opaque masking layer in inactive area IA. The opaque masking layer may have any suitable color.

Openings may be formed in the opaque masking layer in inactive area IA. These openings may form windows for light-based components in device 10. In the example of FIG. 1, window 20 has been formed in inactive area IA along an upper edge of display 14. In general, windows such as window 20 may be formed in any suitable portion of display 14 (i.e., in other portions of inactive area IA) or other transparent structures in device 10. In a laptop computer, for example, a window such as window 20 of FIG. 1 may be located in the center of the uppermost edge of display 14 (e.g., in a configuration in which display 14 is mounted in an upper laptop housing). The configuration of FIG. 1 is merely illustrative.

Window 20 may be circular, rectangular, or may have other suitable shapes. Window 20 may be aligned with a light-based component such an ambient light sensor, proximity sensor, a status indicator light, or a camera. Illustrative configurations in which a camera is aligned with window 20 may sometimes be described herein as an example. In general, however, device 10 may have any suitable number of windows 20, windows 20 may be located in inactive area IA or in active area AA, and any suitable component may be aligned with windows such as window 20. The use of window 20 to allow light to reach a light-based component such as a camera is merely illustrative.

Figure 2A:
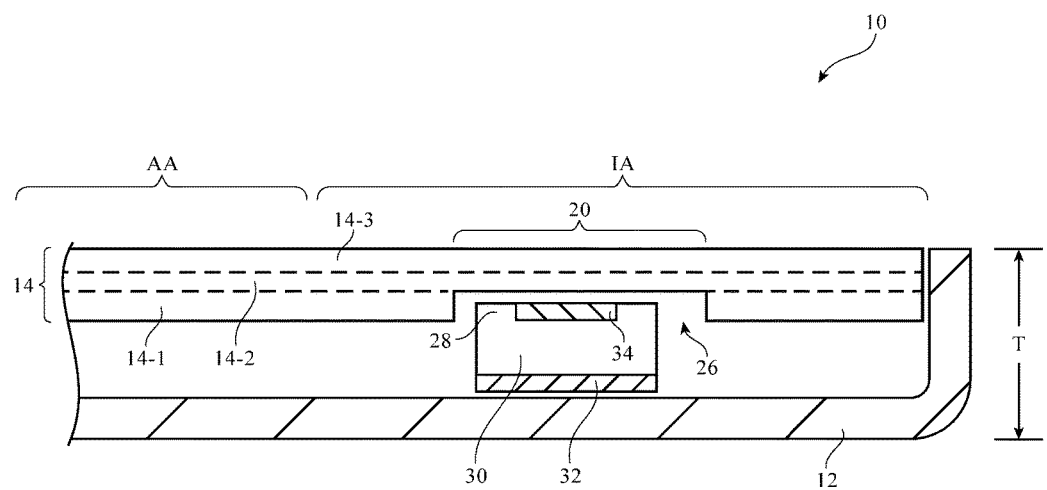
FIG. 2A is a cross-sectional side view of a portion of an illustrative electronic device with a window and an aligned light-based component such as a camera in accordance with an embodiment.

FIG. 2A is a cross-sectional side view of a portion of device 10 of FIG. 1 in the vicinity of window 20 taken along line 22 of FIG. 1 and viewed in direction 24. As shown in FIG. 2A, display 14 may have multiple layers such as layers 14-1, 14-2, and 14-3. With one illustrative configuration, layer 14-1 may be a thin-film transistor layer having a layer of thin-film transistor circuitry on a glass layer that forms pixel electrodes and associated pixel control circuits for a liquid crystal display, layer 14-2 may be a color filter layer having an array of color filter elements on a transparent layer such as a glass layer to provide display 14 with the ability to display color images, and layer 14-3 may be an optional protective display cover layer. If desired, layer 14-1 may be a color filter layer and layer 14-2 may be a thin-film transistor layer. Configurations in which color filter layer structures and thin-film transistor circuitry are formed on a common substrate may also be used in forming display 14. If desired, display cover layer 14-3 may be omitted (e.g., in configurations in which the thickness of layers 14-1 and 14-2 is sufficient to structurally support display 14). Other layers may be used in forming a display such as display 14 if desired (e.g., clear substrate layers, substrate layers in organic light-emitting diode displays and other displays with light-emitting diodes, etc.). The arrangement of FIG. 2A is shown as an example.

An opening such as hole 26 may pass completely through or partly through display 14. The presence of hole 26 may help provide additional space within the interior of housing 12 to accommodate protruding portions 28 of components such as component 30. This allows the thickness T of device 10 to be minimized. If desired, opening 26 may be aligned with window 20. In this type of arrangement, component 30 may be a light-based component that receives light from the exterior of device 10 through window 20 and/or that emits light that passes from the interior of device 10 to the exterior of device 10 through window 20. Component 30 may be, for example, a camera with a digital image sensor such as sensor 32 that captures images focused receives light focused onto sensor 32 by lens 34.

Figure 2B:
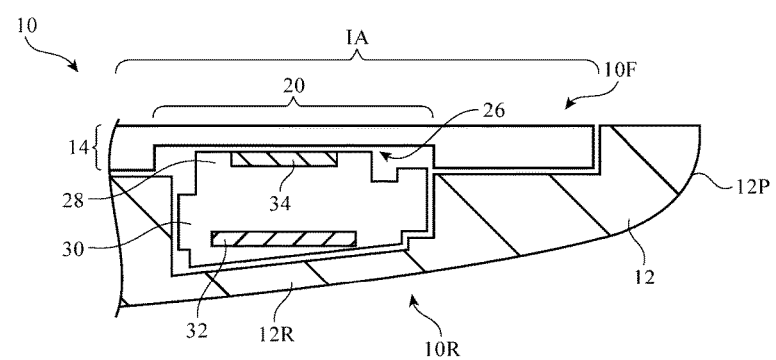
FIG. 2B is a cross-sectional side view of a portion of an electronic device with a housing wall that has a curved profile, a window, and an aligned light-based component that is accommodated by an opening in a portion of a display in the device in accordance with an embodiment.

If desired, device 10 may have one or more non-planar surfaces. Consider, as an example, the arrangement of FIG. 2B. As shown in FIG. 2B, device 10 may have a planar front face 10F on which a planar component such as display 14 is mounted. Device 10 may also have a rear face 10R that includes non-planar rear housing wall surface 12R of housing 12. The rear housing wall of housing 12 may have a gradually eased curved profile or other non-planar profile near the periphery of housing 12 (e.g., in a peripheral portion of housing 12 that is overlapped by inactive area IA of display 14 and, if desired, a peripheral portion of active area AA) and may have a planar shape near the center of housing 12 (e.g., in the portion of housing 12 that is overlapped by active area AA). Opening 26 may be formed in display 14 in alignment with window 20 to help accommodate protruding portion 28 of component 30 (e.g., a camera, other light-based component, or other electrical component). The presence of opening 26 helps allow the thickness of housing 12 and therefore device 10 to be reduced near the periphery of housing 12 (e.g., to better accommodate a desired curved profile for rear housing wall surface 12R than would otherwise be possible). In the absence of opening 26, rear surface 12R would be more planar and less curved at locations near peripheral edge 12P of housing 12.

Optional display cover layer 14-3 and display layers 14-1 and 14-2 may each be formed from a transparent material such as glass, plastic, sapphire or other crystalline material, transparent ceramic, etc. In active area AA, display 14 may contain an array of pixels for displaying images. In inactive area IA, display 14 may have an opaque masking layer that blocks internal device components from view. The opaque masking layer may be formed on one or more of the surfaces of layers such as layers 14-1, 14-2, and 14-3, or other display layers (e.g., polarizer layers, etc.). If desired, black polymer or opaque inorganic structures or other masking material (e.g. a part of the opaque masking layer or one or more additional layers) may be patterned to form a grid with openings that form respective pixels in display 14. These masking structures may be formed on layer 14-1 and/or 14-2.

Opening 26 may be formed by drilling entirely through display 14 (e.g., to form a through-hole), may be formed by drilling partway through display 14 in a configuration in which hole 26 ends in the middle of one of the layers of display 14, or may be formed by forming a through-hole through one or more of the sublayers of display 14. In the example of FIG. 2A, hole 26, which passes only partway through display 14, has been formed by creating a through-hole through a single layer (layer 14-1) without forming any through-holes or partial holes through the other layers of display 14 (i.e., layers 14-2 and 14-3).

If desired, hole 26 may be formed by creating through-holes through multiple layers of display 14 while leaving one or more layers of display 14 intact. For example, hole 26 may be formed by creating through-holes through layers 14-1 and 14-2 without creating any holes in layer 14-3. Configurations of the type shown in FIG. 2A in which hole 26 passes through layer 14-1 without passing through other layers such as layers 14-2 and 14-3 are sometimes described herein as an example.

An advantage of forming hole 26 by creating a through-hole that passes through layer 14-1 without forming any holes in layers 14-2 and 14-3 is that this allows layers 14-2 and 14-3 to remain optically clear and free of scratches that might otherwise impair the transmission of light through the remaining layers of display 14 in window 20.

Display 14 may contain one or more rigid substrate layers such as one or more layers of glass, sapphire or other crystalline transparent material, ceramic, etc. Display 14 may also contain polarizer layers, thin-film coatings, and other layers of material. Backlight structures may be used to provide display 14 with backlight illumination. Hole 26 may be formed through one or more layers such as one or more polarizer layers, one or more rigid substrate layers, coating layer(s), and/or other layers of material in display 14.

Figure 3:
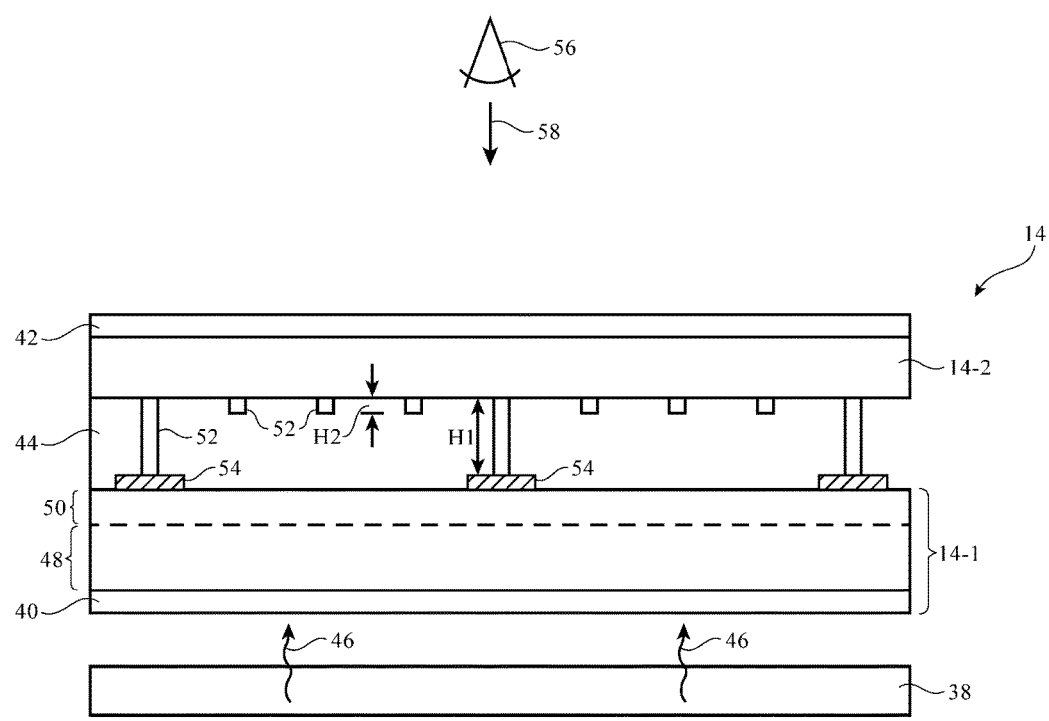
FIG. 3 is a cross-sectional side view of a portion of a display in accordance with an embodiment.

A cross-sectional side view of an illustrative display is shown in FIG. 3. In the example of FIG. 3, display 14 has first and second substrates such as respective layers 14-1 and 14-2. Layer 14-1 may be, for example, a thin-film transistor layer having a layer of thin-film transistor circuitry 50 on a glass layer such as layer 48. Layer 50 may form electrodes and pixel circuits for forming an array of pixels in active area AA of display 14. Layer 14-2 may be a color filter layer. Liquid crystal layer 44 may be interposed between layers 14-1 and 14-2. Layers 14-1 and 14-2 may be sandwiched between upper polarizer 42 and lower polarizer 40 (e.g., thin polymer polarizer films).

Column spacers 52 may be formed on layer 14-2 and/or 14-1 to help maintain a desired separation between display layers 14-1 and 14-2. Column spacer structures in display 14 may be formed from metal, polymer, and/or other materials. With the illustrative configuration of FIG. 3, display 14 has column spacer structures formed from column spacers 52 (e.g., polymer spacers) and corresponding column spacer pads 54 (e.g., metal spacer pads). Polymer column spacers may be formed from a layer of photolithographically patterned photosensitive polymer. Column spacers 52 may have multiple heights. For example, column spacers 52 may include main column spacers of larger height H1 and sub-spacer column spacers (subspacers) of smaller height H2. Configurations with more than two different column spacer sizes may be used, if desired.

Backlight unit 38 may produce backlight illumination 46 for display 14. During operation, the pixels of display 14 create images that are viewed by users such as user 56 who are viewing display 14 in direction 58.

Hole 26 may be formed by laser drilling, mechanical drilling (e.g., drilling with a drill bit), water jet drilling, scribing and breaking techniques, other techniques in which thin regions of glass or other material are broken by applying sufficient mechanical force to create stress that cracks the glass, or other suitable hole formation techniques. With one suitable arrangement, which is described herein as an example, hole 26 is formed partly using mechanical drilling and partly using mechanical stress-induced cracking techniques.

Figure 4:
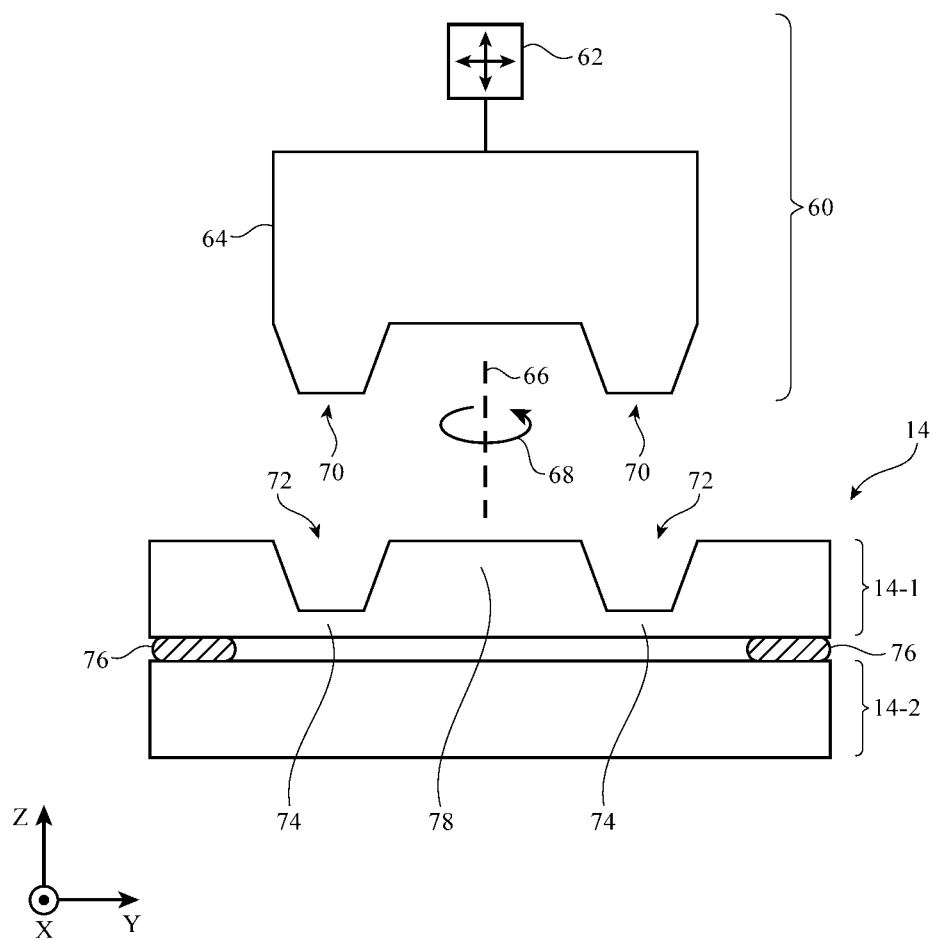
FIG. 4 is a cross-sectional side view of a display containing a partially formed hole in accordance with an embodiment.

An illustrative system for drilling during the formation of hole 26 in display 14 is shown in FIG. 4. As shown in FIG. 4, drilling equipment such as drilling tool 60 may include a drill bit such as drill bit 64 and a drill bit rotating and positioning system such as positioner 62. Tool 60 may use positioner 62 to position drill bit 64 in dimensions X, Y, and Z and to rotate drill bit 64 in direction 68 about rotational axis 66.

Drill bit 64 may be formed from metal, ceramic, or other materials and may have particles and/or coatings to enhance drilling performance (e.g., diamond structures). Drill bit 64 may have any suitable shape. As shown in FIG. 4, for example, drill bit 64 may have an annular shape (e.g., the leading edge of drill bit 64 may form a ring-shaped protrusion such as annular protrusion 70). When drill bit 64 is lowered in direction −Z, annular protruding portion 70 of drill bit 64 will grind into layer 14-1 and will form a ring-shaped recess such as annular groove 72.

To prevent damage to underlying layers of display 14, drilling system 60 may drill only partway into layer 14-1, thereby leaving thin undrilled annular region 74 at the bottom of groove 72. Sealant 76 may be interposed between layers 14-1 and 14-2 and may be used to support the portions of display 14 surrounding groove 72. Region 74 may be sufficiently thin to allow region 74 to be cracked to remove disk-shaped portion 78 of layer 14-1. As an example, the thickness of region 74 may be about 5-10 microns, more than 3 microns, less than 20 microns, or other suitable thickness.

Figure 5:
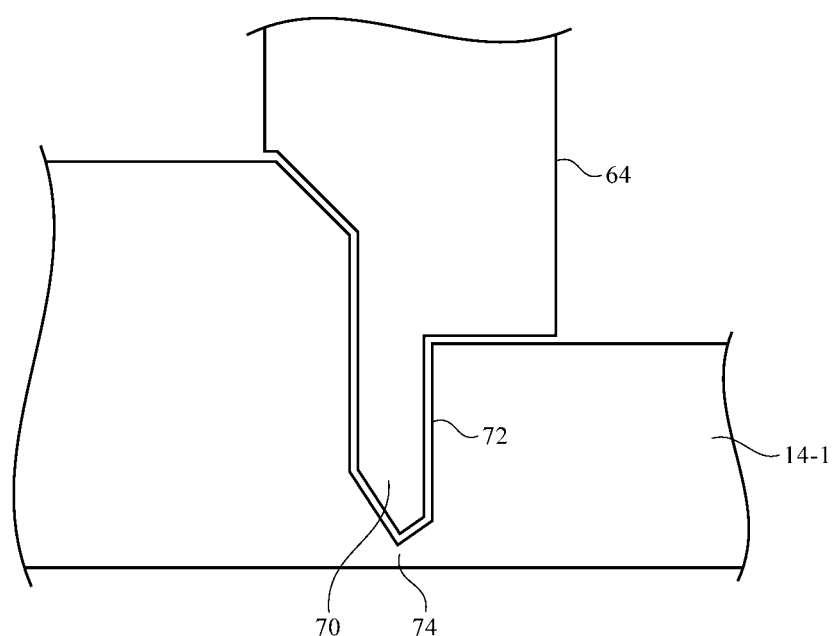
FIG. 5 is a cross-sectional side view of a portion of an annular drill bit and a portion of a drilled display in accordance with an embodiment.

If desired, protrusion 70 on drill bit 64 may have a pointed shape of the type shown in FIG. 5 to help form a sharply tapered profile for groove 72. This helps to concentrate stress in thin region 74 at the bottom of groove 72.

Figure 6:
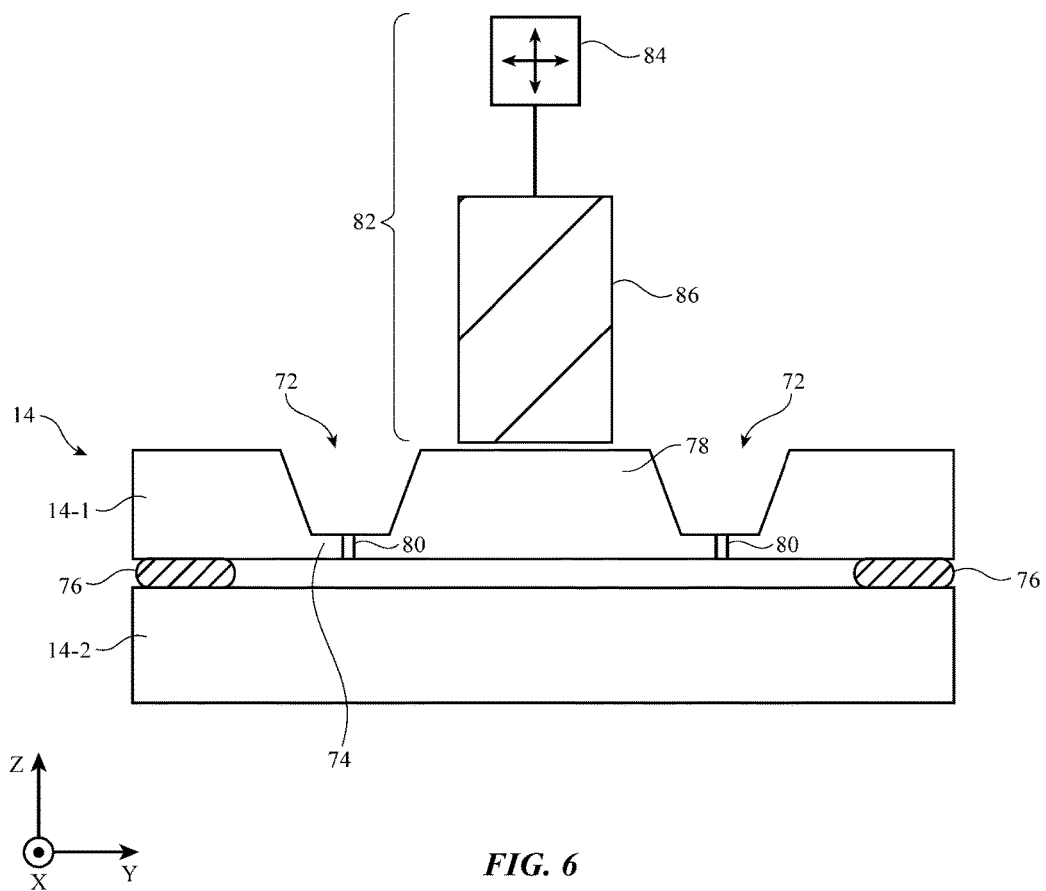
FIG. 6 is a cross-sectional side view of a display with a partially drilled hole in which a tool is being used to crack and remove a disk-shaped portion of a display layer in accordance with embodiment.

FIG. 6 shows how a glass breaking tool such as glass cracking system 82 may be used to crack thinned region 74. System 82 may include a positioner such as positioner 84 that moves movable head 86. Head 86 may be pressed in direction −Z when it is desired to induce stress in thinned annular region 74. This forms annular crack 80. Crack 80 may extend around the periphery of disk-shaped portion 78 and, when formed, may liberate disk 78 from the remainder of layer 14-1. Head 86 may contain a vacuum suction mechanism, suction cup, or other mechanism for gripping disk 78. After applying downward force to disk-shaped portion 78 of display layer 14-1 with system 82 to crack region 74 and thereby separate disk-shaped region 78 of layer 14-1 from the rest of layer 14-1, head 86 may apply suction to disk-shaped portion 78 and may be moved in upward direction Z to remove disk-shaped portion 78 from display 14. This leaves a circular through-hole (hole 26) in layer 14-1 without forming any holes in layer 14-2. A deburring tool (e.g., a rotating bit) may be used to smooth the inner surfaces of hole 26 following removal of disk 78.

Figure 7:
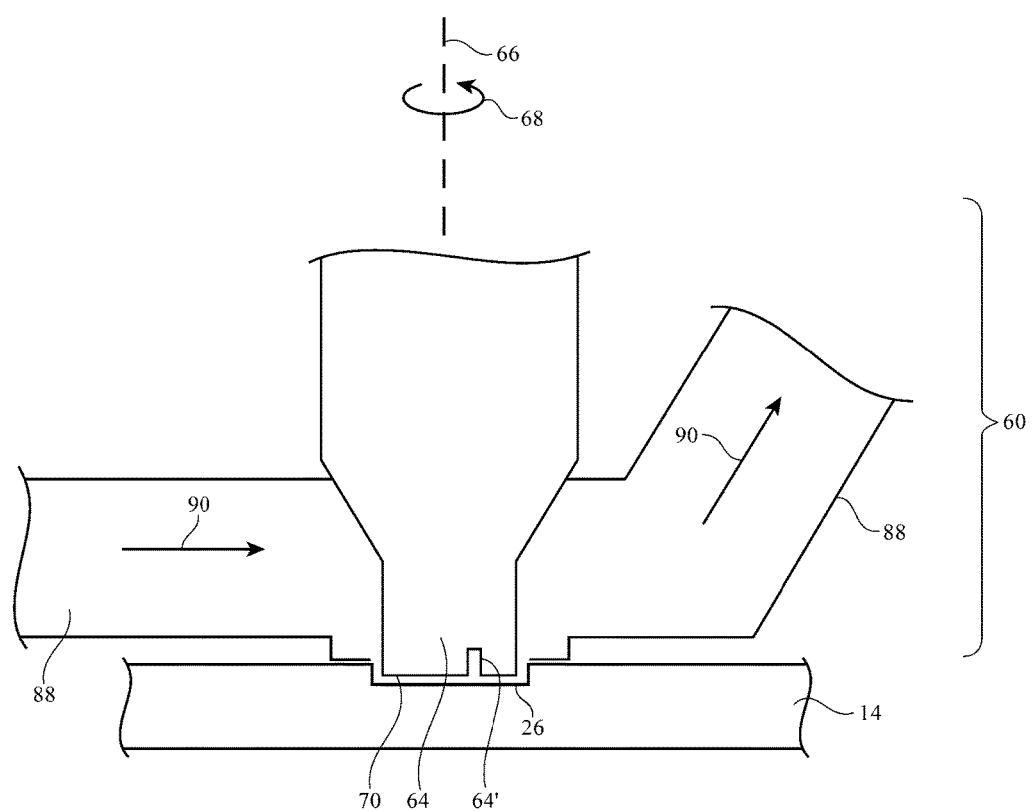
FIG. 7 is a cross-sectional side view of an illustrative annular drill bit with slots to facilitate coolant flow and debris removal during drilling in accordance with an embodiment.
Figure 8:
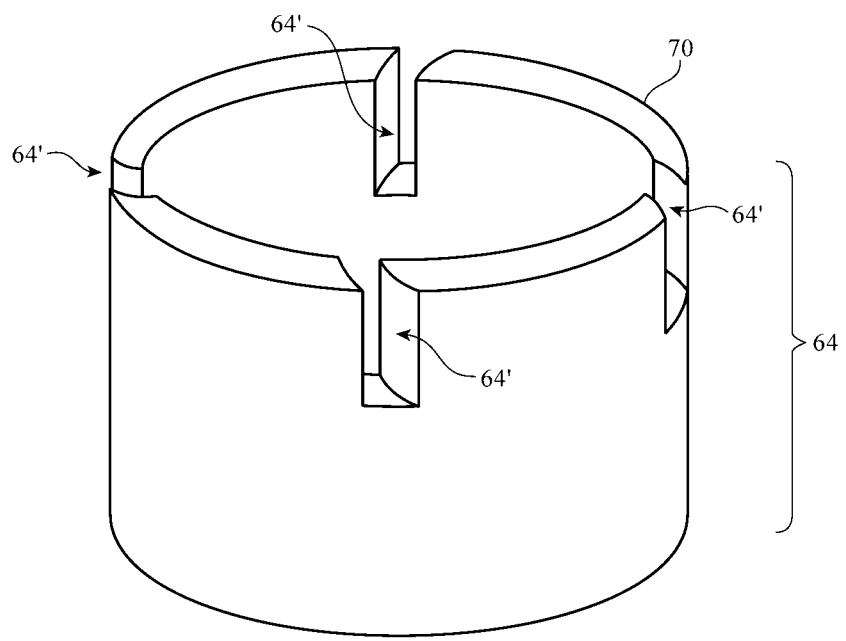
FIG. 8 is a perspective view of an illustrative annular drill bit of the type shown in FIG. 7 in accordance with an embodiment.

If desired, tool 60 may include cooling structures. As shown in the cross-sectional side view of FIG. 7, for example, tool 60 may include fluid passageways 88 that allow water or other cooling liquid to flow into hole 26 and around drill bit 64 during drilling to help cool drill bit 64 and the regions of display 14 surrounding hole 26. To facilitate fluid flow through and around drill bit 64 as drill bit 64 is rotated in direction 68 about rotational axis 66, drill bit 64 may have fluid passageways such as slots 64'. Slots 64' may be arranged around the periphery of protrusion 70 and may spiral outwardly from the center of drill bit 64 as shown in FIG. 8. Fluid flow promotion structures of other shapes may be formed in drill bit 64 if desired. The shape used for slots 64' in FIG. 8 is merely illustrative.

Sealant 76 may be formed from epoxy or other adhesive (e.g., ultraviolet light cured epoxy, etc.). A bead of sealant 76 may run around the periphery of display 14 between layers 14-1 and 14-2 to confine liquid crystal layer 44 within active area AA of display 14 and to hold layers 14-1 and 14-2 together. As shown in the top view of display 14 of FIG. 9, strips of sealant 76 may form a ring that surrounds hole 26. The ring may have straight sides, curved sides, combinations of curved and straight edges, may have multiple concentric strips of material, may have a circular shape, hexagonal shape, rectangular shape, or other suitable shape. Sealant 76 may be located close to hole 26 (e.g., sealant 76 may be 100-300 microns from hole 26, may be 200-600 microns from hole 26, may be within 300 microns of hole 26, or may be 5-300 microns from hole 26). This creates structural support for layers 14-1 and 14-2 in the vicinity of hole 26 that cushions and protects these layers during drilling operations by absorbing vibrations and stress. The sealant that surrounds hole 26 also helps prevent liquid crystal material 44 or other material from intruding into hole 26. If desired, the sealant adjacent to hole 26 may partially surround hole 26 (e.g., the sealant may have a half-hexagon shape that runs around half of hole 26, may have a segmented circular, hexagonal, or rectangular shape with gaps, etc.). Configurations in which the sealant forms a hexagonal ring or a ring of other suitable shapes (circular, rectangular, etc.) that surround hole 26 may help ensure satisfactory vibration absorption.

Figure 9:
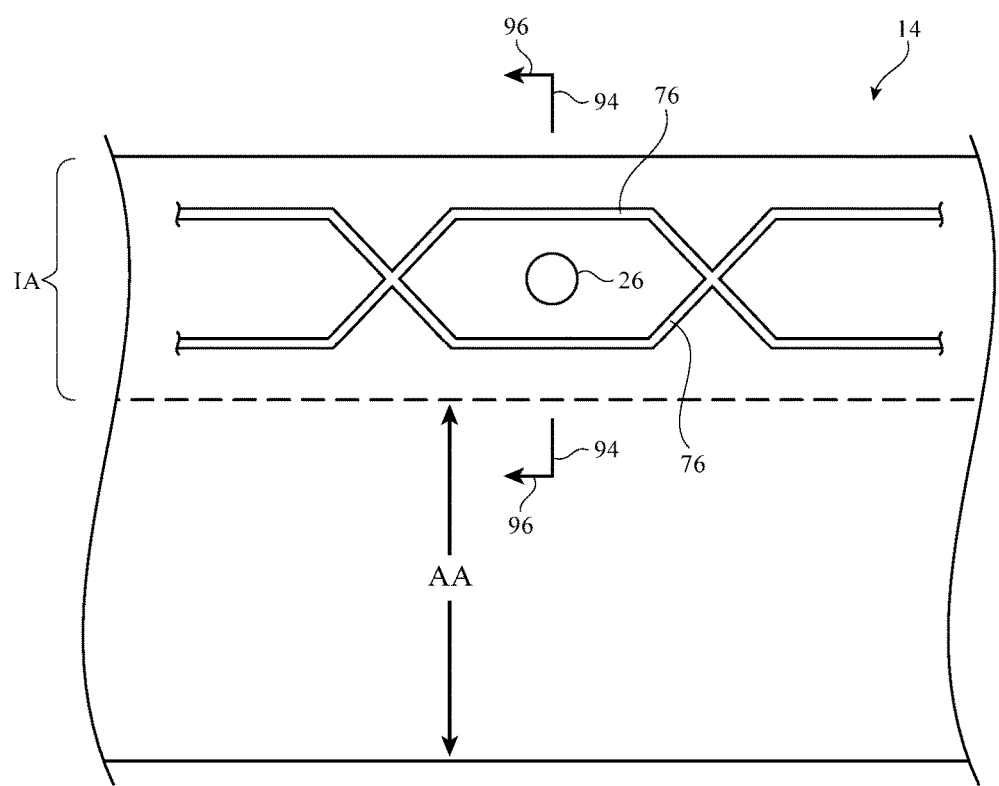
FIG. 9 is a top view of an edge portion of a display showing an illustrative sealant pattern having a ring-shaped portion that is used to surround a hole in accordance with an embodiment.
Figure 10:
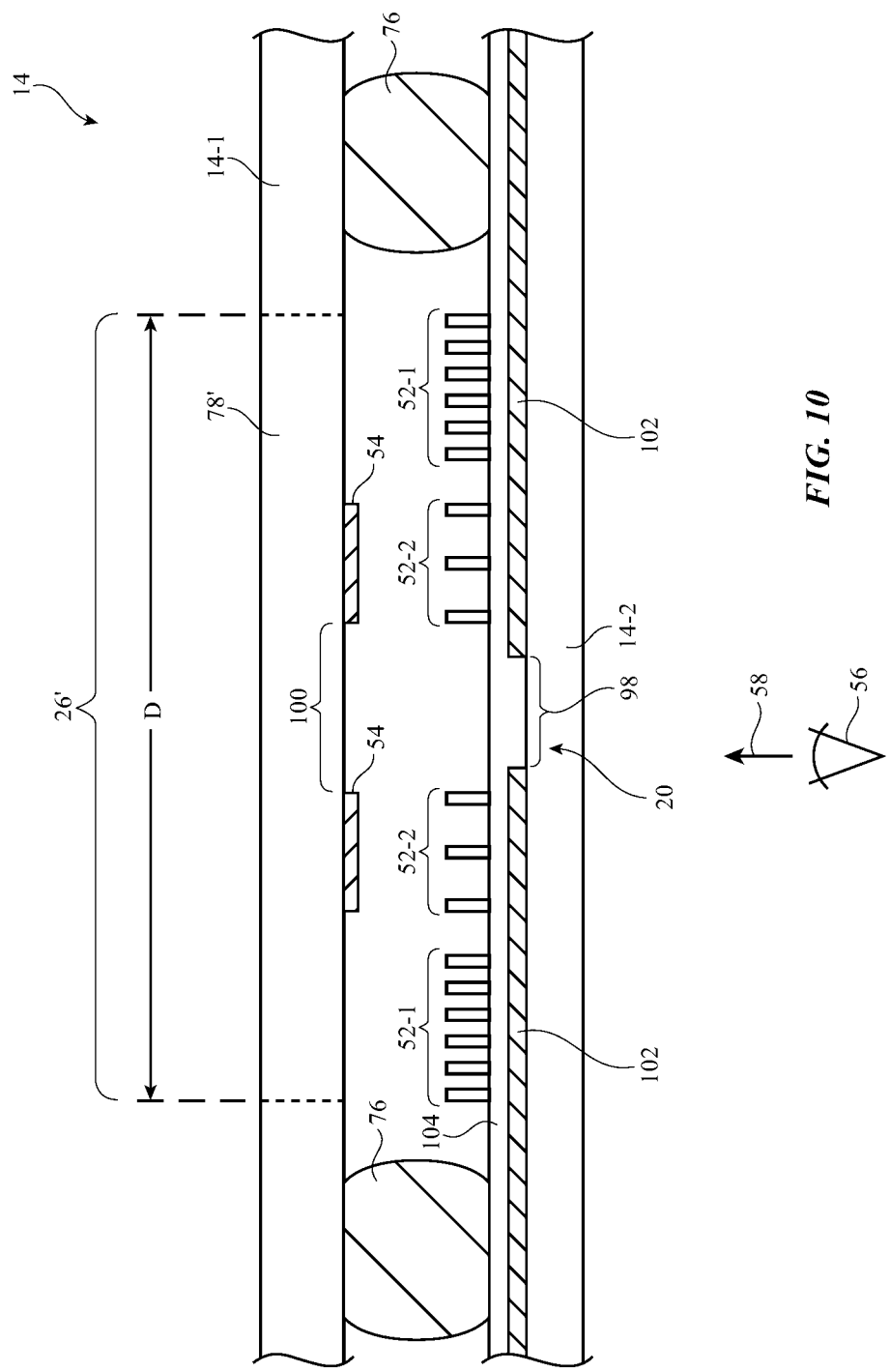
FIG. 10 is a cross-sectional side view of an illustrative display with features to facilitate hole formation through a subset of the layers of the display in accordance with an embodiment.

A cross-sectional side view of display 14 taken along line 94 and viewed in direction 96 of FIG. 9 prior to formation of hole 26 is shown in FIG. 10. Hole 26 may be drilled through layer 14-1 in region 26'. A ring of structures or structures with other shapes may be formed from the metal layer of pad structures 54 (e.g., a ring having an opening such as opening 100 that can serve as an alignment mark for hole 26). When drilled, hole 26 may have a diameter D. The outer edge of region 26' may be separated from sealant 76 by a gap of 200-600 microns or other suitable distance. Column spacers 52 may be formed within region 26' (i.e., in a region that is overlapped by hole 26 when hole 26 is drilled) to help support waste material produced during hole drilling and hole deburring operations while protecting underlying structures on the surface of layer 14-2.

As shown in FIG. 10, layer 14-2 may be coated with an opaque masking layer such as opaque masking layer 102. Transparent overcoat layer 104 (e.g., a clear polymer layer) may cover masking layer 102. In active area AA, masking layer 102 may form a black matrix with openings that are filled with color filter elements for the pixels of display 14. In inactive area IA, black masking layer 102 may cover display 14 and may help hide internal components and sealant 76 from view by a viewer 56 when display 14 is used in device 10. Opening 98 in layer 102 may form a light passageway for window 20. Opening 98 may have a diameter of 2 mm, 1-3 mm, more than 0.5 mm, less than 4 mm, or other suitable size.

During hole formation, disk-shaped portion 78 of layer 14-1 may be removed from layer 14-1. At least part of a camera or other component may then occupy space previously occupied by portion 78 in alignment with window 20. For example, camera 30 may be mounted in alignment with window 20 so that some of camera 30 protrudes out of hole 26 and so that some of camera 30 is mounted within hole 26.

Column spacers 52 in region 26' may be subspacer column spacers or other suitable column spacers. Column spacers 52 in region 26' may be formed from the same layer of photoimageable polymer that is used in forming column spacers that protrude into liquid crystal layer 44 from layer 14-2 in active area AA. The use of subspacers for forming the column spacer structures of FIG. 10 may help accommodate glass bending during drilling operations.

The density of column spacers 52 (i.e., the pitch of column spacers 52, which determines the spacing between adjacent spacers) may vary as a function of position within region 26'. In the example of FIG. 10, column spacers 52 include a first set of column spacers 52-1 and a second set of column spacers 52-2. Column spacers 52-2 may be formed in a ring surrounding opening 98 and may have a relatively low density and high spacing (e.g., a spacer-to-spacer spacing of about 75-150 microns, more than 50 microns, less than 200 microns, etc.). The innermost of spacers 52-2 may be separated from the edge of opening 98 by a distance of about 175-225 microns, more than 150 microns, less than 250 microns, or other suitable distance. The ring of column spacers 52-2 that surrounds opening 98 may have a width (outer radius minus inner radius) of about 600-800 microns, more than 500 microns, less than 1000 microns, or other suitable width. Column spacers 52-1 may be formed in a ring that surrounds the ring formed from spacers 52-2. Spacers 52-1 may be spaced 50 microns apart from each other, may be spaced 25-75 microns apart, may be spaced more than 30 microns apart, or may be spaced fewer than 60 microns apart (as examples). The width of the ring formed from spacers 52-1 may be about 800-1000 microns, more than 700 microns, less than 1100 microns, or other suitable width.

The use of different densities for column spacers 52-1 and 52-2 allows column spacers to be selectively configured either to enhance protection for layer 14-2 (e.g., by closely spacing column spacers 52-1 to help protect the coating layers on layer 14-2) or to facilitate debris removal during drilling (e.g., by spacing column spacers 52-2 farther apart than spacers 52-1 to help allow debris to be removed by vacuum suction). Configurations with smoothly varying column spacer density gradients or three or more regions of column spacers of different spacing densities (or two or more spacing densities, four or more spacing densities, etc.) may also be used.

Figure 11:
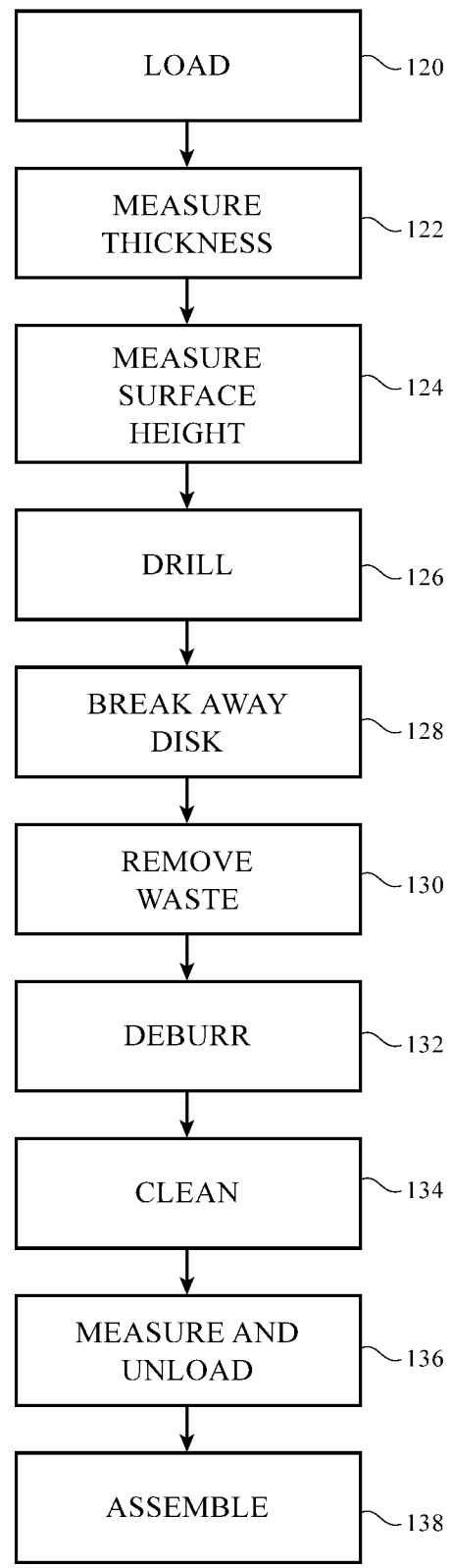
FIG. 11 is a flow chart of illustrative steps involved in forming holes in displays in accordance with an embodiment.

Illustrative steps involved in forming a device having a display with a hole are shown in FIG. 11.

Display layers 14-1 and 14-2 and the other layers of display 14 may be fabricated and laminated together in the form of large mother glass panels. Sealant 76 may be dispensed in strips and other patterns between the mother glass panels using a needle dispensing tool or other adhesive patterning equipment. When cured, sealant 76 attaches display layers 14-1 and 14-2 together. Following singulation to form individual display panels 14, a display panel may be loaded into a workpiece holder (step 120).

While in the workpiece holder, a thickness measurement tool such as an optical triangulation sensor that takes light readings from the top and bottom surfaces of transparent layers may be used to measure the thickness of layer 14-1 (step 122).

A position sensor (e.g., a position sensor with a movable pin) may then be used to locate the Z-axis position of the exposed outer surface of layer 14-1 (step 124).

At step 126, drilling tool 60 may be used to drill partway through layer 14-1, leaving thinned region 74 in place at the bottom of drilled annular groove 72. The thickness and position information gathered during steps 122 and 124 may be used to accurately locate drill bit 64.

At step 128, glass breaking tool 82 may be used to crack layer 14-1 along thinned region 74 and may be used to remove the resulting disk-shaped portion of layer 14-1 (disk 78) from layer 14-1. This forms hole 26 in layer 14-1 without creating any partially or fully drilled holes in layer 14-2.

At step 130, a vacuum suction tool or other equipment may be used to remove waste from hole 26. Hole deburring operations may be performed at step 132 to remove any residual portions of thinned region 74 from hole 26. Panel cleaning operations may be performed at step 134. Display 14 may then be measured, inspected, and unloaded from the workpiece holder (step 136) before being assembled into device 10 (step 138). During the assembly operations of step 138, a component such as component 30 may be mounted fully or partly within opening 26 in alignment with window 20 and may be interposed between housing 12 and layer 14-2, as shown in FIG. 2.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a housing;
   a display mounted in the housing, wherein the display comprises:
      a first substrate layer, wherein the first substrate layer includes at least one metal column spacer pad;
      a second substrate layer, wherein the first substrate layer has a hole that passes through the first substrate layer without penetrating the second substrate layer; and
      a plurality of column spacers on the second substrate layer that are overlapped by the hole, wherein the plurality of column spacers comprise polymer, wherein at least one of the column spacers corresponds to the at least one metal column spacer pad, and wherein the plurality of column spacers include a first set of column spacers having a first spacing density and a second set of column spacers having a second spacing density that is less than the first spacing density; and
   a light-based component in the housing that has a portion that protrudes into the hole.

2. The electronic device defined in claim 1 wherein the display further comprises sealant adjacent to the hole.

3. The electronic device defined in claim 2 wherein the sealant forms a ring of sealant that surrounds the hole and the column spacers.

4. The electronic device defined in claim 1 wherein the column spacers in the first set of column spacers are spaced apart from each other by 25-75 microns and the column spacers in the second set of column spacers are spaced apart from each other by 75-150 microns.

5. The electronic device defined in claim 4 wherein the display further comprises an opaque masking layer on the second substrate layer with an opening that is aligned with the hole, wherein the second set of column spacers has a ring shape that surrounds the opening in the opaque masking layer.

6. The electronic device defined in claim 5 wherein the first set of column spacers has a ring shape that surrounds the second set of column spacers.

7. The electronic device defined in claim 1 wherein the display further comprises a liquid crystal layer interposed between the first and second substrate layers, wherein the column spacers are formed from a polymer layer and wherein at least some additional column spacers that are formed from the polymer layer are located on the second substrate layer and extend into the liquid crystal layer.

8. The electronic device defined in claim 7 wherein the additional column spacers include main column spacers and subspacers and wherein the column spacers that are overlapped by the hole are subspacers.

9. An electronic device, comprising:
a display having a thin-film transistor layer, a color filter layer, and a liquid crystal layer interposed between the thin-film transistor layer and the color filter layer, wherein the thin-film transistor layer includes column spacer pads, wherein the display has an active area configured to display images and an inactive area, wherein the thin-film transistor layer has a hole in the inactive area that passes through the thin-film transistor layer without penetrating the color filter layer, wherein the display comprises a plurality of column spacers on the color filter layer that are overlapped by the hole and by the column spacer pads, wherein the display has a ring of sealant that surrounds the hole and that is attached to the thin-film transistor layer and the color filter layer;
a housing having a surface with a curved profile in a portion of the housing that is overlapped by the inactive area; and
a light-based component in the housing that has a portion that protrudes into the hole.

10. The electronic device defined in claim 9 wherein the light-based component comprises a camera.

11. The electronic device defined in claim 9 wherein some of the column spacers protrude into the liquid crystal layer and are surrounded by the sealant that surrounds the hole.

12. An electronic device, comprising:
a housing;
a display in the housing, wherein the display has a first substrate layer and a second substrate layer, wherein the display has a hole that passes through the first substrate layer without penetrating the second substrate layer, wherein the display has a ring of sealant that surrounds the hole, wherein the ring of sealant is directly attached to the first substrate layer and a first surface of the second substrate layer, wherein the display comprises a mask on the second substrate layer having an opening, wherein the display comprises first and second groups of column spacers on the second substrate layer, wherein the first group of column spacers has a first spacing density corresponding to a first pitch, wherein the second group of column spacers has a second spacing density corresponding to a second pitch that is different from the first pitch, wherein the first group of column spacers is formed in a ring around the opening, wherein the second group of column spacers is formed in a ring around the first group of column spacers, and wherein each column spacer of the second group of column spacers is further from the opening than the column spacers of the first group of column spacers; and
an electrical component in the housing that has a portion that protrudes into the hole.

13. The electronic device defined in claim 12 wherein the mask is an opaque masking layer and wherein the opening is aligned with the electrical component.

14. The electronic device defined in claim 13 wherein the electrical component comprises a light-based component.

15. The electronic device defined in claim 14 wherein the display further comprises:
a liquid crystal layer between the first and second substrate layers, wherein some of the column spacers protrude into the liquid crystal layer and wherein some of the column spacers are overlapped by the hole and are surrounded by the sealant that surrounds the hole.

16. The electronic device defined in claim 15 further comprising an overcoat layer that covers the opaque masking layer and the opening, wherein the overcoat layer is interposed between the column spacers that are overlapped by the hole and the opaque masking layer.

17. The electronic device defined in claim 16 wherein the electrical component comprises a camera.

18. A method for forming a display, comprising:
attaching a first substrate layer to a second substrate layer with adhesive, wherein the first substrate layer includes at least one metal column spacer pad and wherein the second substrate layer includes an opaque masking layer having an opening and wherein a ring of the adhesive surrounds the opening;
with a drilling tool, drilling an annular groove in the first substrate layer without penetrating entirely through the first substrate layer so that an annular thinned region of the first substrate layer is formed within the annular groove;
cracking the annular thinned region to remove a disk-shaped portion of the first substrate layer and form a hole in the first substrate layer; and
forming a polymer layer on the second substrate layer substrate that includes a plurality of column spacers between the first and second substrate layers in an active area of the display and that has at least one portion that is surrounded by the ring of adhesive, wherein at least one of the plurality of column spacers corresponds to the at least one metal column spacer pad, wherein the ring of adhesive overlaps the opaque masking layer, wherein the plurality of column spacers is overlapped by the hole, and wherein the plurality of column spacers include a first set of column spacers having a first spacing density and a second set of column spacers having a second spacing density that is less than the first spacing density.

* * * * *